(12) United States Patent
Basker et al.

(10) Patent No.: US 11,145,551 B2
(45) Date of Patent: Oct. 12, 2021

(54) FINFET DEVICES

(71) Applicant: Tessera, Inc., San Jose, CA (US)

(72) Inventors: Veeraraghavan S. Basker, Schenectady, NY (US); Kangguo Cheng, Schenectady, NY (US); Theodoras E. Standaert, Clifton Park, NY (US); Junli Wang, Slingerlands, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 16/911,158

(22) Filed: Jun. 24, 2020

(65) Prior Publication Data
US 2020/0328124 A1     Oct. 15, 2020

Related U.S. Application Data

(60) Continuation of application No. 16/265,110, filed on Feb. 1, 2019, now Pat. No. 10,699,962, which is a
(Continued)

(51) Int. Cl.
*H01L 21/8234* (2006.01)
*H01L 21/762* (2006.01)
(Continued)

(52) U.S. Cl.
CPC ......... *H01L 21/823481* (2013.01); *H01L 21/02636* (2013.01); *H01L 21/30604* (2013.01);
(Continued)

(58) Field of Classification Search
CPC ......... H01L 21/76224; H01L 21/02636; H01L 21/30604; H01L 21/324; H01L 27/0886;
(Continued)

(56) References Cited

U.S. PATENT DOCUMENTS 5,639,688 A     6/1997 Delgado et al.
7,435,671 B2   10/2008 Fuller et al.
(Continued)

FOREIGN PATENT DOCUMENTS

| CN | 101533218 A | 9/2009 |
|----|-------------|--------|
| WO | 2012128843 A2 | 9/2012 |
| WO | 2013065384 A1 | 5/2013 |

OTHER PUBLICATIONS

List of IBM Patents or Patent Applications treated as Related, 1 page.

*Primary Examiner* — David Vu
*Assistant Examiner* — Brandon C Fox
(74) *Attorney, Agent, or Firm* — Lee & Hayes, P.C.

(57) ABSTRACT

FinFET devices and processes to prevent fin or gate collapse (e.g., flopover) in finFET devices are provided. The method includes forming a first set of trenches in a semiconductor material and filling the first set of trenches with insulator material. The method further includes forming a second set of trenches in the semiconductor material, alternating with the first set of trenches that are filled. The second set of trenches form semiconductor structures which have a dimension of fin structures. The method further includes filling the second set of trenches with insulator material. The method further includes recessing the insulator material within the first set of trenches and the second set of trenches to form the fin structures.

19 Claims, 8 Drawing Sheets

Related U.S. Application Data continuation of application No. 15/813,277, filed on Nov. 15, 2017, now Pat. No. 10,276,658, which is a continuation of application No. 15/417,597, filed on Jan. 27, 2017, now Pat. No. 10,014,221, which is a continuation of application No. 15/182,048, filed on Jun. 14, 2016, now Pat. No. 9,613,869, which is a division of application No. 14/750,013, filed on Jun. 25, 2015, now Pat. No. 9,685,507.

(51) Int. Cl.
  *H01L 29/78* (2006.01)
  *H01L 29/06* (2006.01)
  *H01L 29/417* (2006.01)
  *H01L 21/02* (2006.01)
  *H01L 21/306* (2006.01)
  *H01L 21/324* (2006.01)
  *H01L 27/088* (2006.01)
  *H01L 29/66* (2006.01)

(52) U.S. Cl.
  CPC ...... *H01L 21/324* (2013.01); *H01L 21/76224* (2013.01); *H01L 21/823431* (2013.01); *H01L 27/0886* (2013.01); *H01L 29/0649* (2013.01); *H01L 29/41791* (2013.01); *H01L 29/6653* (2013.01); *H01L 29/785* (2013.01)

(58) Field of Classification Search
  CPC .......... H01L 29/0649; H01L 29/41791; H01L 29/6653; H01L 29/785
  USPC ................................. 438/696, 702
  See application file for complete search history.

(56) References Cited

U.S. PATENT DOCUMENTS

| | | | |
|---|---|---|---|
| 7,799,505 B2 | 9/2010 | Kodama et al. | |
| 7,824,975 B2 | 11/2010 | Joung et al. | |
| 8,048,813 B2 * | 11/2011 | Lai | H01L 21/0337 438/736 |
| 8,084,825 B2 | 12/2011 | Fuller et al. | |
| 8,309,427 B2 * | 11/2012 | Fishburn | H01L 27/10802 438/430 |
| 8,431,329 B2 * | 4/2013 | Bae | H01L 21/0273 430/312 |
| 8,481,410 B1 | 7/2013 | LiCausi et al. | |
| 8,501,607 B1 * | 8/2013 | Juengling | H01L 29/66795 438/587 |
| 8,524,605 B1 | 9/2013 | Chen | |
| 8,658,532 B2 | 2/2014 | Chang | |
| 8,764,999 B2 | 7/2014 | Dunn et al. | |
| 8,790,867 B2 | 7/2014 | Bae et al. | |
| 8,802,561 B1 | 8/2014 | Yeh et al. | |
| 8,822,320 B2 | 9/2014 | Cheng et al. | |
| 8,883,649 B2 | 11/2014 | Yin et al. | |
| 8,889,561 B2 | 11/2014 | Woo et al. | |
| 9,054,212 B2 | 6/2015 | Juengling | |
| 9,087,870 B2 | 7/2015 | Tong et al. | |
| 9,287,135 B1 * | 3/2016 | Doris | H01L 21/3212 |
| 9,385,189 B1 | 7/2016 | Sung et al. | |
| 9,536,793 B1 | 1/2017 | Zhang et al. | |
| 9,613,869 B2 | 4/2017 | Basker et al. | |
| 9,685,507 B2 | 6/2017 | Basker et al. | |
| 10,014,221 B2 | 7/2018 | Basker et al. | |
| 10,141,402 B2 | 11/2018 | Basker et al. | |
| 10,157,797 B2 | 12/2018 | Basker et al. | |
| 2012/0217204 A1 | 8/2012 | Sjong | |
| 2012/0244711 A1 | 9/2012 | Yin et al. | |
| 2013/0140638 A1 | 6/2013 | Dixit | |
| 2013/0217204 A1 * | 8/2013 | Park | H01L 21/76283 438/424 |
| 2013/0309838 A1 * | 11/2013 | Wei | H01L 21/823821 438/424 |
| 2014/0367795 A1 | 12/2014 | Cai et al. | |
| 2015/0056781 A1 * | 2/2015 | Akarvardar | H01L 29/66795 438/413 |
| 2016/0163850 A1 | 6/2016 | Liu et al. | |
| 2016/0379887 A1 | 12/2016 | Basker et al. | |
| 2016/0379892 A1 | 12/2016 | Basker et al. | |
| 2016/0380051 A1 | 12/2016 | Basker et al. | |
| 2017/0018452 A1 | 1/2017 | Dou et al. | |
| 2017/0140995 A1 | 5/2017 | Basker et al. | |
| 2018/0076094 A1 | 3/2018 | Basker et al. | |

* cited by examiner

FINFET DEVICES

CROSS-REFERENCE TO RELATED APPLICATION

This patent application is a continuation of and claims priority to U.S. patent application Ser. No. 16/265,110, filed Feb. 1, 2019, which is a continuation of U.S. patent application Ser. No. 15/813,277, filed Nov. 15, 2017, now U.S. Pat. No. 10,276,658, issued Apr. 30, 2019, which is a continuation of U.S. patent application Ser. No. 15/417,597, filed Jan. 27, 2017, now U.S. Pat. No. 10,014,221, issued Jul. 3, 2018, which is a continuation of U.S. patent application Ser. No. 15/182,048, filed Jun. 14, 2016, now U.S. Pat. No. 9,613,869, issued Apr. 4, 2017, which is a divisional of U.S. patent application Ser. No. 14/750,013, filed Jun. 25, 2015, now U.S. Pat. No. 9,685,507, issued Jun. 20, 2017, which disclosures are fully incorporated herein by reference.

FIELD OF THE INVENTION

The invention relates to semiconductor structures and, more particularly, to finFET devices and processes to prevent fin or gate collapse (e.g., flopover) in finFET devices.

BACKGROUND

Semiconductor device manufacturing generally includes various steps of device patterning process. With continuous scale-down and shrinkage of real estate available for a single semiconductor device, engineers are daily facing the challenge of how to meet the market demand for ever increasing device density. One technique was the creation of finFETs, which are formed through a technique called sidewall image transfer (SIT), also known as sidewall spacer image transfer. However, due to the scaling of these devices, there remains a risk of pattern collapse for tight pitch and high aspect ratio configurations, such as the fin or gate modules.

SUMMARY

In an aspect of the invention, a method comprises forming a first set of trenches in a semiconductor material and filling the first set of trenches with insulator material. The method further comprises forming a second set of trenches in the semiconductor material, alternating with the first set of trenches that are filled. The second set of trenches form semiconductor structures which have a dimension of fin structures. The method further comprises filling the second set of trenches with insulator material. The method further comprises recessing the insulator material within the first set of trenches and the second set of trenches to form the fin structures.

In an aspect of the invention a method comprises: forming trenches in semiconductor material; filling the trenches with insulator material; and forming additional trenches in the semiconductor material to form fin structures, anchored by the filled trenches.

In an aspect of the invention, a structure comprises a plurality of fin structures which are supported by insulator material at a bottom portion thereof, such that the fin structures are partially exposed.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to finFET devices and processes to prevent fin or gate collapse (e.g., flopover) in finFET devices. In more specific embodiments, the processes described herein ensure that fins of the finFET and gates are always anchored on one side during fin formation thus preventing fin and/or gate collapse (e.g., flopover). After fin reveal, a channel is fully exposed, but at an acceptable aspect ratio. Accordingly, in embodiments, the processes described herein ensures the aspect ratio is limited or the high aspect ratio features, e.g., fins of a finFET, are physically anchored on one side. Also, advantageously, the processes described herein reduce the risk of pattern collapse for tight pitch and high aspect ratio configurations, such as the fin or gate module. The processes described herein can also be used to fabricate asymmetrical finFET devices.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
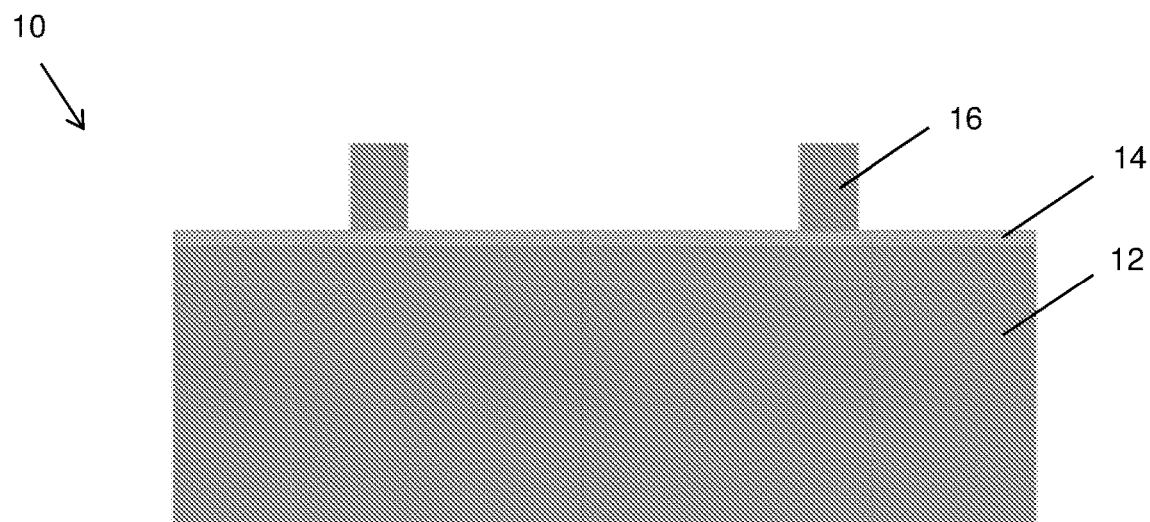
FIG. 1 shows a semiconductor substrate with mandrels and respective fabrication processes in accordance with aspects of the invention.

FIG. 1 shows a structure and respective processes in accordance with aspects of the present invention. In particular, the structure 10 of FIG. 1 shows an oxide or other insulator material 14 formed on a substrate 12. In embodiments, the substrate 14 can be a silicon substrate or other semiconductor material, e.g., any suitable material including, but not limited to, Si, SiGe, SiGeC, SiC, GE alloys, GaAs, InAs, InP, and other III/V or II/VI compound semiconductors.

A plurality of mandrels 16 are formed on the insulator material 14 using conventional lithography and etching processes. For example, the mandrel material, e.g., silicon, can be deposited on the insulator material 14 using conventional deposition methods, e.g., chemical vapor deposition (CVD) process. In embodiments, the mandrel material can be a silicon, e.g., amorphous or polycrystalline silicon. A resist is formed over the mandrel material, which is exposed to energy (e.g., light) in order to form openings (patterns). The exposed mandrel material is then etched through the openings of the resist to form the illustrative pattern shown in FIG. 1. In embodiments, a width of the mandrel 16 should be roughly a final fin spacing at two times a final fin pitch. For example, assuming a target of a fin pitch of about 25 nm, with a 7 nm fin width, the mandrel should then be at roughly 18 nm (25 nm−7 nm=18 nm) at a pitch of 50 nm (25 nm×2 nm=50 nm); although other dimensions are also contemplated by the present invention depending on the technology node.

Figure 2:
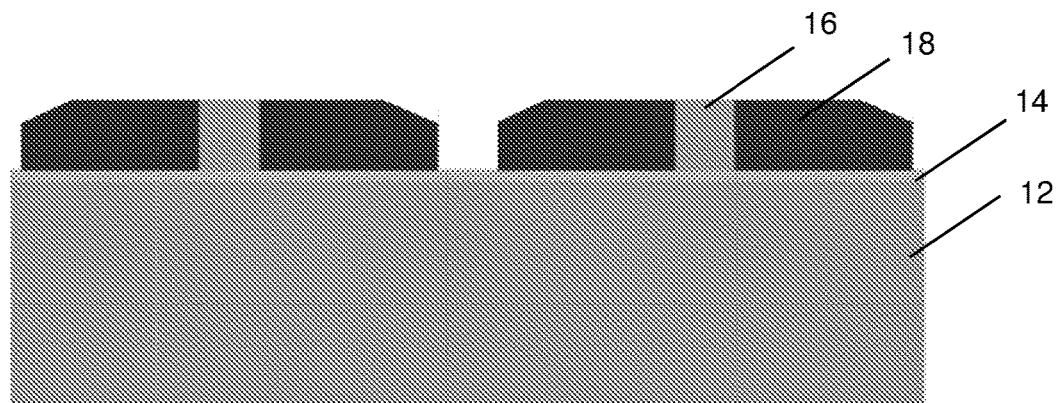
FIG. 2 shows sidewalls formed on the mandrels and respective fabrication processes in accordance with aspects of the invention.

In FIG. 2, a sidewall spacer 18 is formed on the mandrels 16. In embodiments, the sidewall spacer 18 can be a nitride spacer formed using conventional deposition and etching processes. For example, the spacer material can be blanket deposited on the mandrels 16 and exposed underlying insulator material 14. An anisotropic etching process can then be performed to form the sidewall spacer 18.

Figure 3:
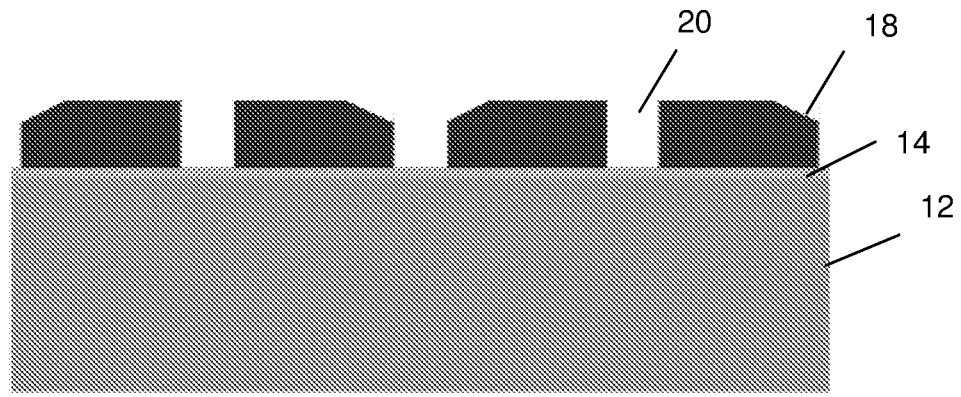
FIG. 3 shows sidewalls with spacing therebetween and respective fabrication processes in accordance with aspects of the invention.

As shown in FIG. 3, the mandrels (e.g., mandrels 16 shown in FIG. 2) are removed, leaving behind the sidewall spacer 18. The mandrels can be removed by using a selective etching process of the silicon material. The spacing 20 between the sidewall spacers 18 is equivalent to the width of the mandrels.

Figure 4:
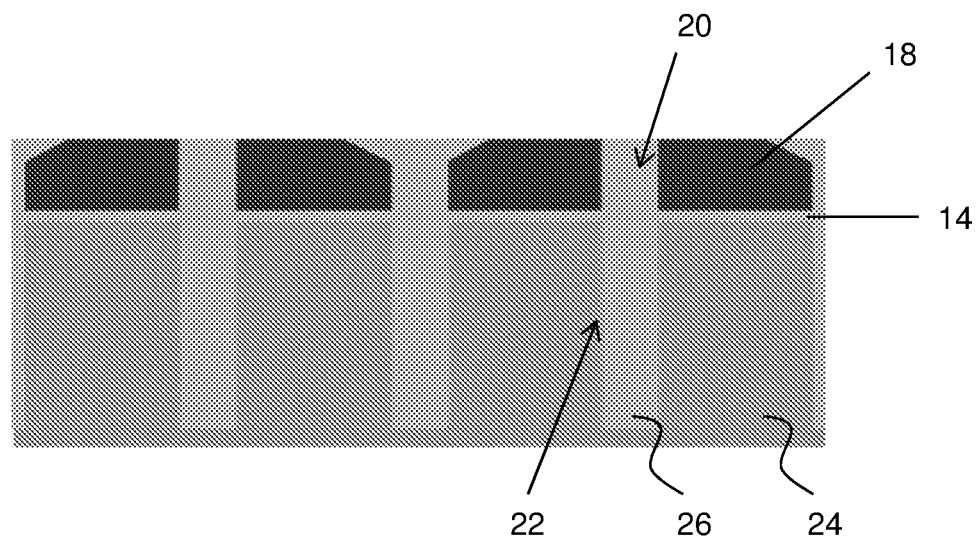
FIG. 4 shows insulator filled trenches and respective fabrication processes in accordance with aspects of the invention.

In FIG. 4, trenches 22 are formed in the substrate 12 and the insulator material 14, aligned with the spacing 20. In embodiments, the trenches 22 are formed by conventional etching processes, e.g., reactive ion etching (RIE). The etching results in silicon features 24, which are roughly two times a fin width plus one fin spacing. For example, following the above example, the silicon features 24 should be 32 nm (2 nm×7 nm+18 nm=32 nm), with a pitch of 50 nm; although other dimensions are contemplated by the present invention, depending on the technology node.

The trenches 22 are filled with insulator material 26 such as oxide. In embodiments, the insulator material 26 can be deposited using a CVD process or a plasma enhanced CVD (PECVD), followed by an etch back process or planarization process, e.g., chemical mechanical polish (CMP). In alternative embodiments, the trenches 22 can be filled using a flowable oxide followed by an anneal process. In yet still additional embodiments, the oxide fill can be a flowable oxide process, and if needed followed by a partial recess process, e.g., etch back, and replaced with a high quality high-density-plasma (HDP), CVD oxide. The HDP oxide 26 can then undergo an etch back or planarization process as already described herein.

Figure 5:
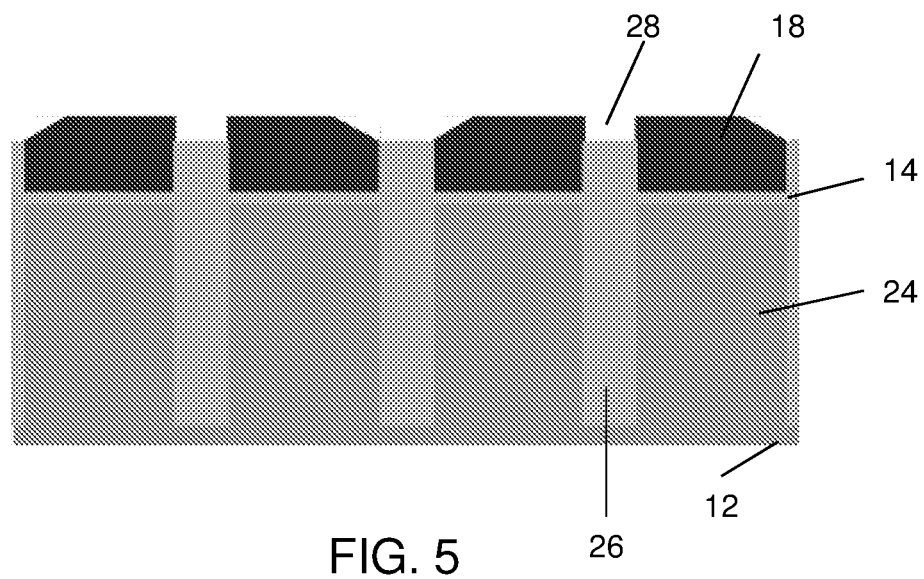
FIG. 5 shows recessed insulator filled trenches and respective fabrication processes in accordance with aspects of the invention.

As shown in FIG. 5, any remaining oxide or insulator material on the spacers 18 can be removed using a deglazing process. For example, a DHF process can be used to remove oxide from a surface of the nitride spacers 18. During the deglazing process, the insulator material 26 can be slightly etched back to form recesses 28 between the spacers 18. In embodiments, the etch depth of the recesses 28 can be on the order of 10 Å to about 50 Å; although other dimensions are also contemplated by the present invention.

Figure 6:
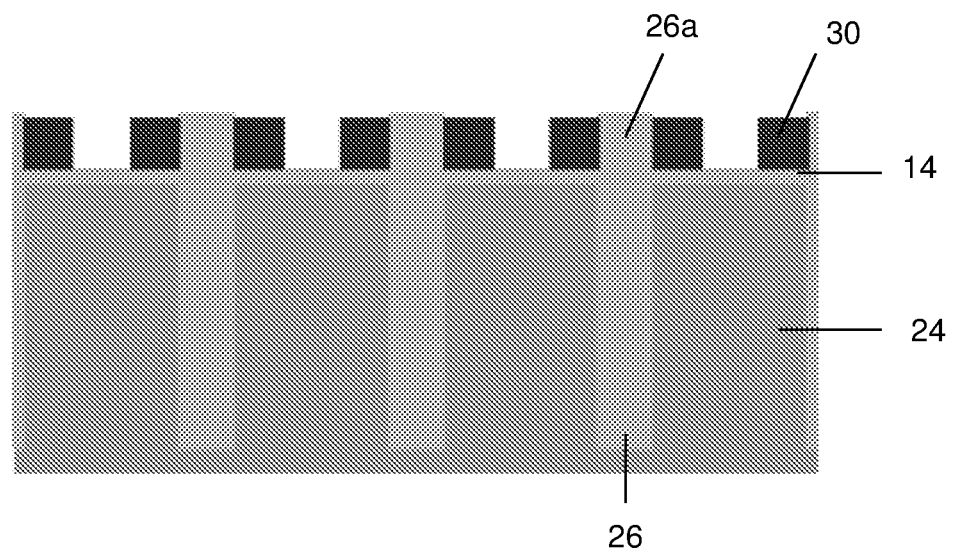
FIG. 6 shows inner sidewalls on sidewalls of the insulator material and respective fabrication processes in accordance with aspects of the invention.

In FIG. 6, remaining portions of the spacers can be removed using a hot phosphorus process. This process will expose a portion 26a of the insulator material 26 above the insulator material 14 and the substrate 12. Inner spacers 30 can be formed on the exposed portion 26a of the insulator material 26. In embodiments, the inner spacers 30 can be formed by a conformal deposition process such as an atomic layer deposition (ALD) process. After the deposition process, the conformal material can be etched by an anisotropic etching process to form the inner spacers 30. In embodiments, the width of the inner spaces can be about 5 nm to 50 nm, which define the dimensions of subsequently formed fins. It should be understood by those of skill in the art, though, that other dimensions are also contemplated by the present invention depending on the technology node. In embodiments, the inner spacers 30 can be a nitride material.

Figure 7:
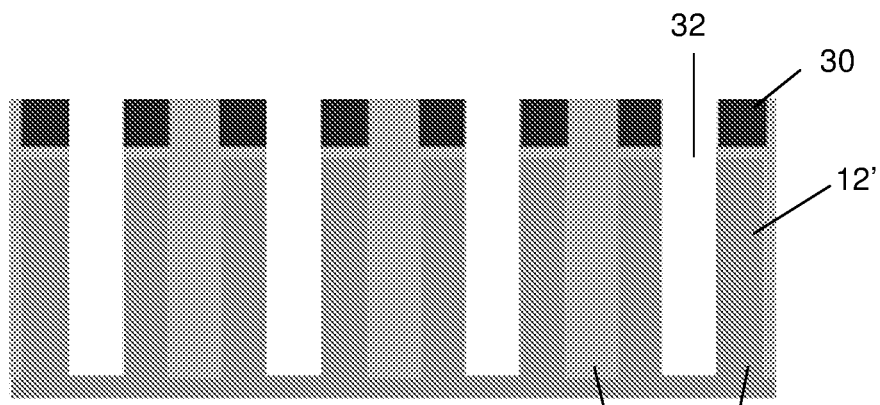
FIG. 7 shows fin structures anchored by insulator material and respective fabrication processes in accordance with aspects of the invention.

As shown representatively in FIG. 7, trenches 32 are formed in the substrate 12 which result in the formation of fin structures 12'. During the formation of the fin structures 12', the fin structures 12' remain anchored or supported by the insulator material 26 on opposing sides thereof. The trenches 32 can be formed using conventional etching processes, e.g., RIE.

Figure 8:
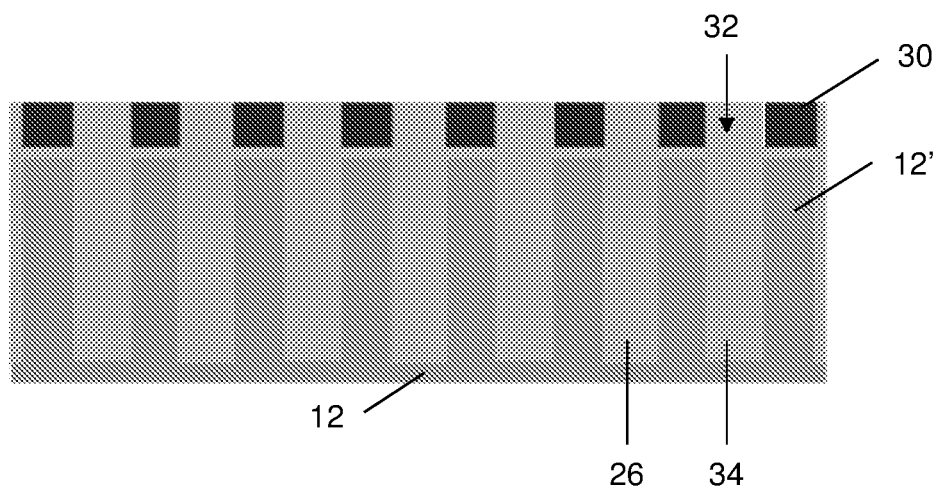
FIG. 8 shows additional insulator filled trenches and respective fabrication processes in accordance with aspects of the invention.

In FIG. 8, the trenches 32 are filled with an insulator material 34, followed by an etch back or planarization process (e.g., CMP). In embodiments, the insulator material 34 can be deposited using a CVD process or a plasma enhanced CVD (PECVD), followed by an etch back process or planarization process, e.g., chemical mechanical polish (CMP). In alternative embodiments, the trenches 32 can be filled using a flowable oxide followed by an anneal process, and if needed followed by a partial recess process, e.g., etch back, and replaced with a high quality high-density-plasma (HDP), CVD oxide.

Figure 9:
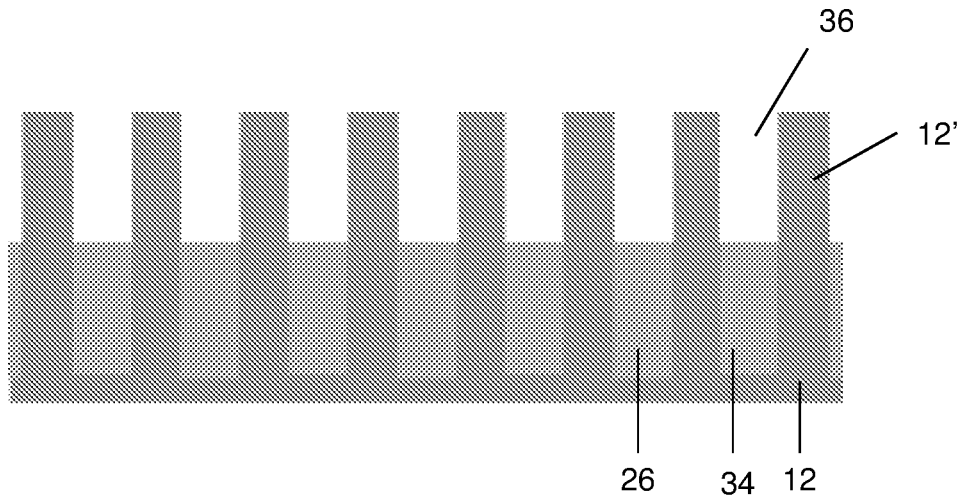
FIG. 9 shows partially revealed fin structures and respective fabrication processes in accordance with aspects of the invention.

As shown in FIG. 9, the insulator material 34 and 26 are recessed to partially reveal the fin structures 12'. In more specific embodiments, any remaining oxide or insulator material on the inner spacers (e.g., inner spacers 30 shown in FIG. 7) can be removed using a deglazing process. For example, a HDF process can be used to remove oxide from a surface of the nitride spacers. Following the deglazing process, the spacers can be removed (e.g., by hot phosphorous), following by the insulator material 26, 34 being etched back to form recesses 36 between the fin structures 12'. In embodiments, the insulator material 26, 34 are recessed using conventional selective etching process as should be understood by those of skill in the art. In embodiments, the insulator material 26, 34 are recessed to partially expose or reveal the fin structures 12'. In other words, the fin structures 12' are not exposed at a full aspect ratio, and remain supported at a bottom portion thereof by the insulator material 26, 34.

Figure 10:
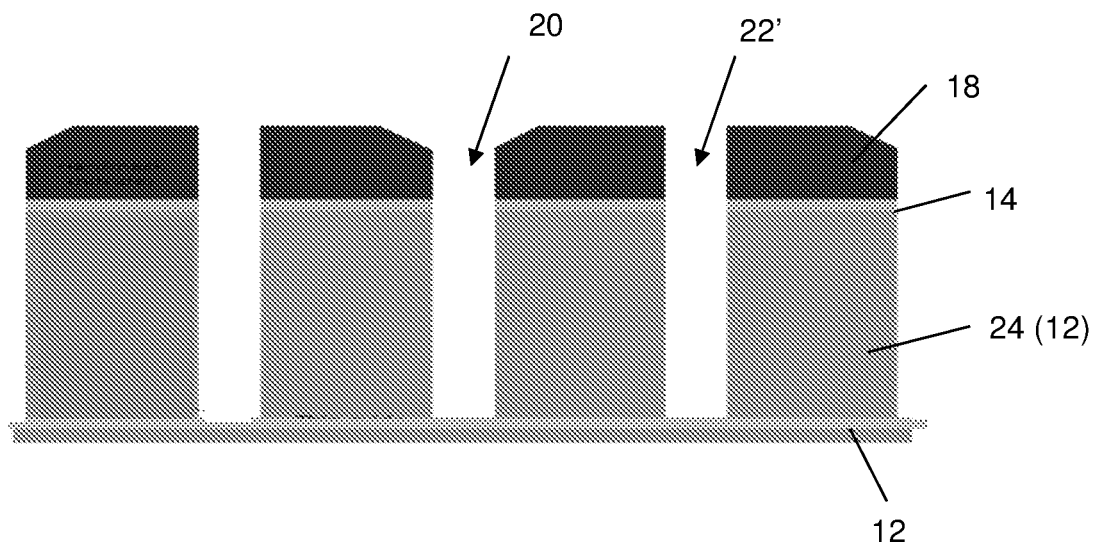
FIG. 10 shows trenches and other features within the semiconductor material and respective fabrication processes in accordance with aspects of the invention.

FIGS. 10-17 show alternative structures and fabrication processes in accordance with aspects of the invention. In particular, FIG. 10 shows a structure 10' which includes trenches 22' formed in the manner as described with respect to FIG. 4. For example, a plurality of mandrels are formed on the insulator material 14 using conventional lithography and etching processes. A spacer 18 is formed on the mandrels. In embodiments, the spacer 18 can be formed by deposition of a nitride material, e.g., using conventional deposition, followed by an anisotropic etching process. The mandrels (e.g., mandrels 16) are removed, leaving behind the spacers 18 with a spacing 20 therebetween. The trenches 22' are then formed in the substrate 12 and the insulator material 14, aligned with the openings 20. In embodiments, the trenches 22' are formed by conventional etching processes, e.g., reactive ion etching (RIE), resulting in silicon features 24 which are roughly two times a (dummy) gate width plus one (dummy) gate spacing.

Figure 11:
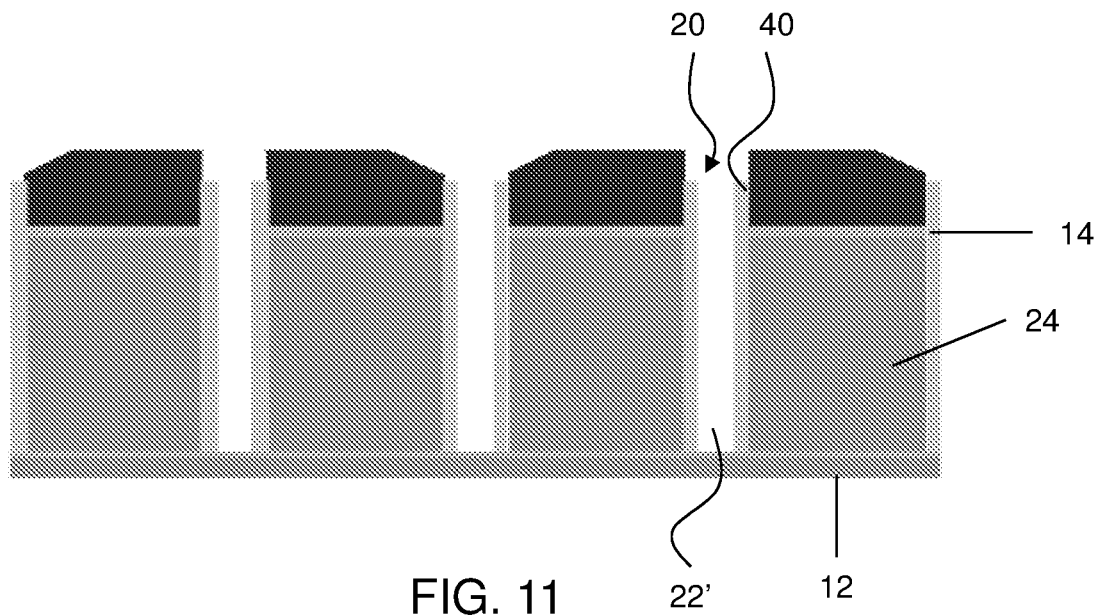
FIG. 11 shows liner material formed on sidewalls of the trenches and respective fabrication processes in accordance with aspects of the invention.

In FIG. 11, the trenches 22 are lined with sidewall material 40. In embodiments, the liner 40 can be a low-k dielectric spacer, e.g., SiCBN or SiOCN. The thickness of the liner 40 can be about 3 nm to 6 nm, depending on the technology node. In embodiments, the liner 40 can be formed by a conformal deposition process, e.g., ALD or CVD, followed by an anisotropic etching process.

Figure 12:
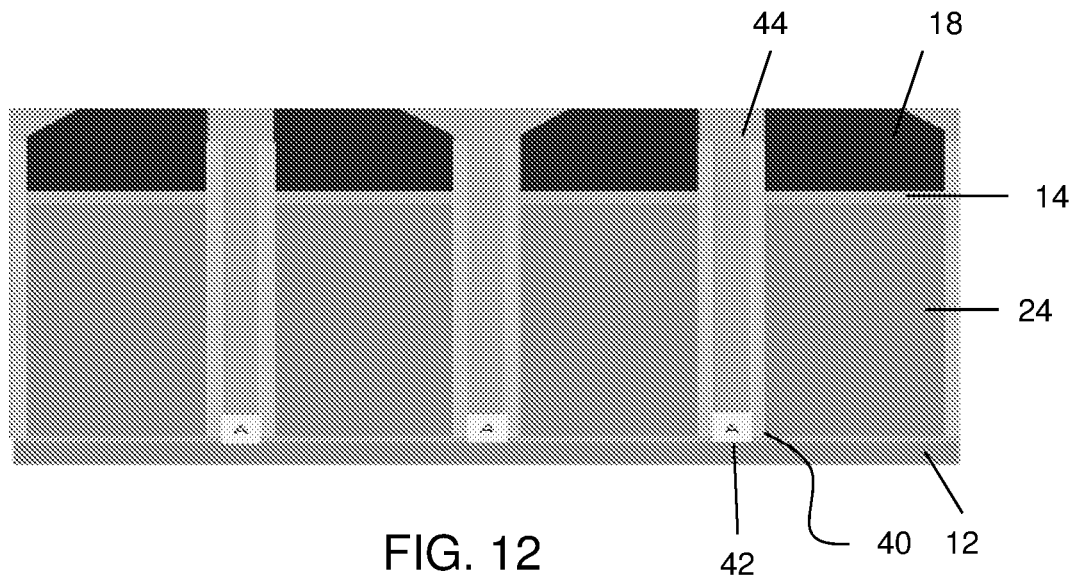
FIG. 12 shows insulator material filled within the trenches and respective fabrication processes in accordance with aspects of the invention.

As shown in FIG. 12, an epitaxial growth 42 is formed on one side of the device. In embodiments, the epitaxial growth 42 can be an in-situ doped material, e.g., BSiGe for a PFET device and SiP for NFET. In alternate embodiments, the in-situ doped material can be Si:CP or Si:P for an NFET. Following the epitaxial growth 42, a liner can be formed on the sidewall material 40 followed by an oxide fill both of which are represented at reference numeral 44. The liner can be a thin nitride liner (e.g., on the order of 2 nm). The oxide fill can be a flowable oxide process, followed by a partial recess process, e.g., etch back, and replaced with a high quality high-density-plasma (HDP), CVD oxide. The HDP oxide can then undergo an etch back or planarization process as already described herein.

Figure 13:
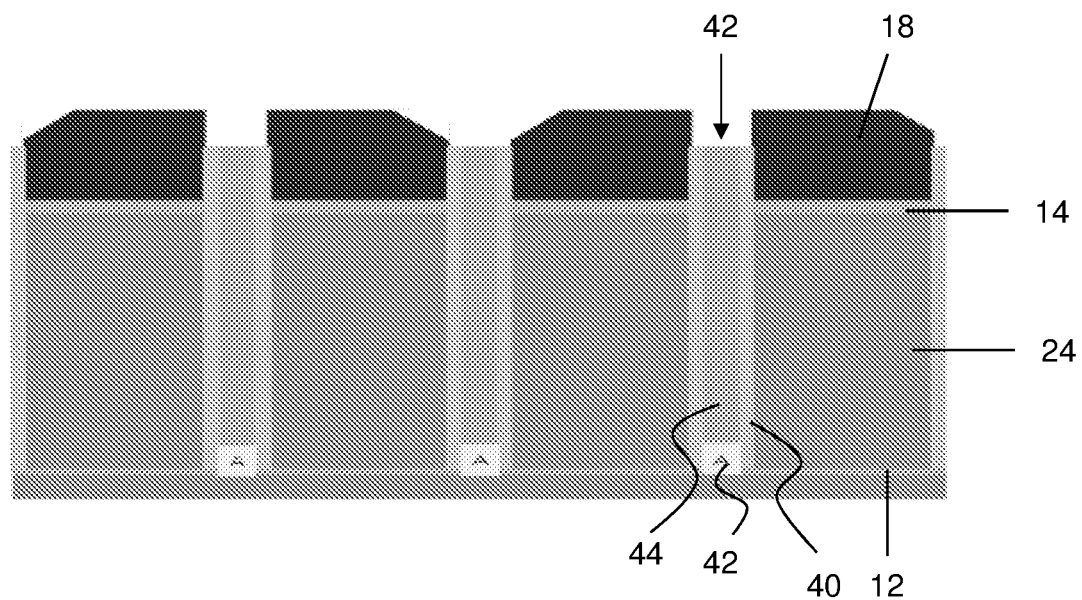
FIG. 13 shows recesses formed from insulator material and respective fabrication processes in accordance with aspects of the invention.

In FIG. 13, the HDP oxide 44 can be etched back to form a recess 46 followed by a deglaze process of the nitride spacers 18. As already described herein, any remaining oxide or insulator material on the spacers 18 can be removed using a deglazing process. For example, a DHF process can be used to remove oxide from a surface of the nitride spacers 18. In embodiments, the etch depth of the insulator material (oxide) can be on the order of 10 Å to about 50 Å; although other dimensions are also contemplated by the present invention.

Figure 14:
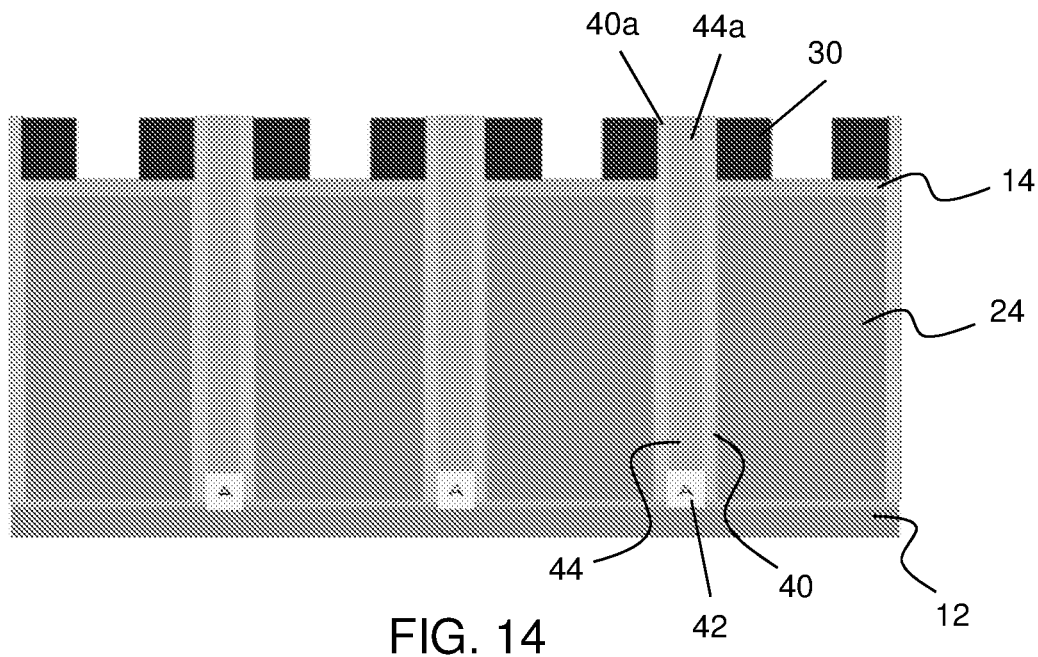
FIG. 14 shows inner sidewalls formed on the insulator material and respective fabrication processes in accordance with aspects of the invention.

As shown in FIG. 14, the spacers can be removed following the deglazing process. For example, any remaining portions of the spacers can be removed using a hot phosphorus process. This process will leave a portion 44a of the insulator material 44 and liner material 40a above the insulator material 14 and the substrate 12. Inner spacers 30 can be formed on the liner material 40a. In embodiments, the inner spacers 30 can be formed by a conformal deposition process such as an atomic layer deposition (ALD) process, followed by an anisotropic etching process. In embodiments, the width of the inner spaces 30 can be about 5 nm to 50 nm, which define the dimensions of subsequently formed (dummy) gate. It should be understood by those of skill in the art, though, that other dimensions are also contemplated by the present invention depending on the technology node.

Figure 15:
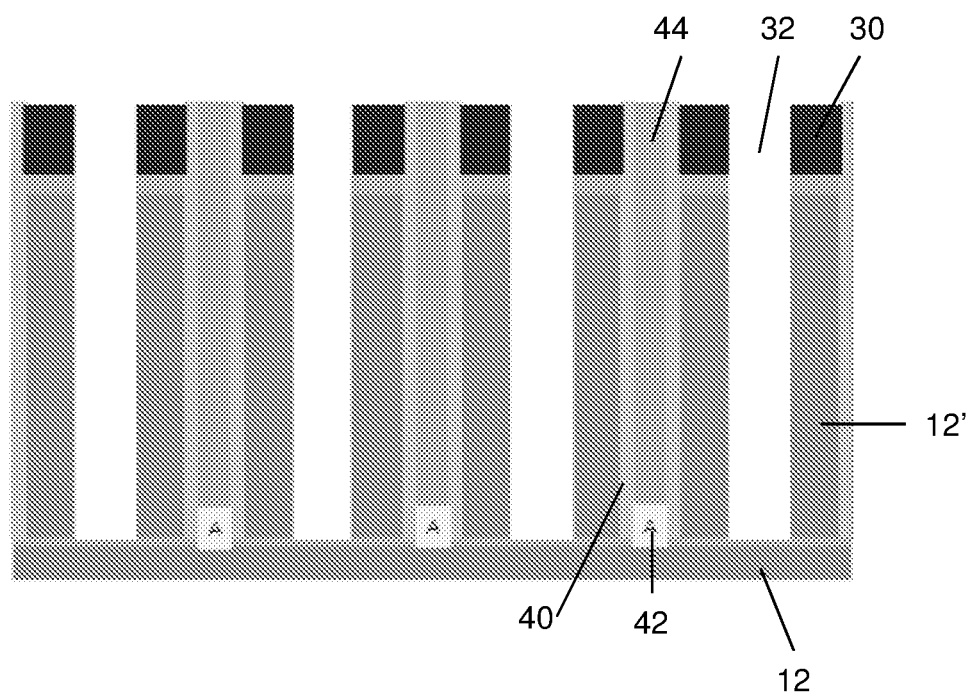
FIG. 15 shows dummy gate structures anchored with insulator material in the semiconductor material and respective fabrication processes in accordance with aspects of the invention.

In FIG. 15, trenches 32 are formed in the substrate 12 which result in the formation of (dummy) gate structures 12'. During the formation of the (dummy) gate (dummy) gate structures 12', the fin structures 12' remain anchored by the insulator material 44 and liner 40 on opposing sides thereof.

Figure 16:
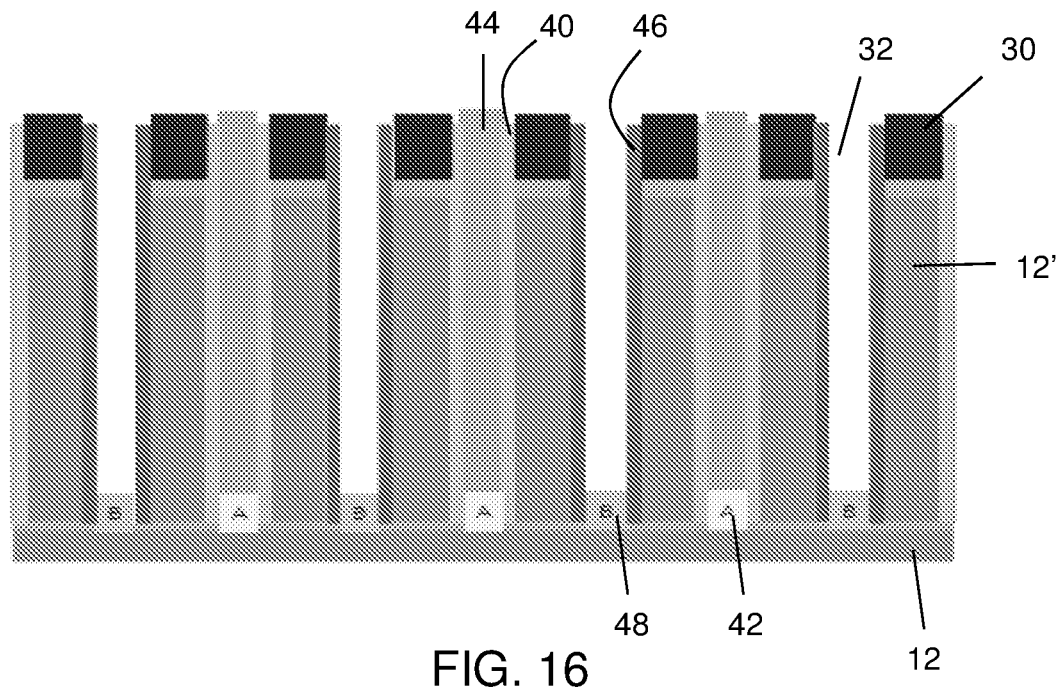
FIG. 16 shows additional trenches lined with sidewall material and respective fabrication processes in accordance with aspects of the invention.

In FIG. 16, the trenches 32 are then lined with a liner 46. In embodiments, the liner 46 can be the same or different material than the liner 40. By way of example, the liner 46 can be a low-k dielectric spacer, e.g., SiCBN or SiOCN, formed using conventional deposition processes, followed by an anisotropic etching. The thickness of the liner 46 can be about 3 nm to 6 nm, depending on the technology node. In embodiments, the thickness of the liner 46 can be different than that of the liner 40. For example, the liner 46 can be thinner on the source side of the device, than on the drain side of the device. Also, in embodiments, the liner 46 can be a low-k dielectric material on the drain side of the device, and the liner 40 can be a regular or high-k dielectric on the source side of the device. In any scenario, though, the liner 46 can be formed by a conformal deposition process, e.g., ALD or CVD, followed by an anisotropic etching process.

Still referring to FIG. 16, an epitaxial growth 48 is formed on another side of the device (e.g., opposite side of the gate structure from epitaxial growth 42). The epitaxial growth 48 can be different than the epitaxial growth 42 in terms of dopants and dopant concentration, for example. For example, depending on the epitaxial growth 42, the epitaxial growth 48 can be, e.g., an in-situ doped material, e.g., BSiGe for a PFET device and SiP for NFET. In alternate embodiments, the in-situ doped material can be Si:CP or Si:P for an NFET. In this way, an asymmetrical finFET device can be formed. In embodiments, if one side has N-type doping, the other side should also be N-type. But dopant concentration can be different between the two sides, or one could even change the dopant type (bit still keep it N-type if the other side has N, or P if the other side is P).

Figure 17:
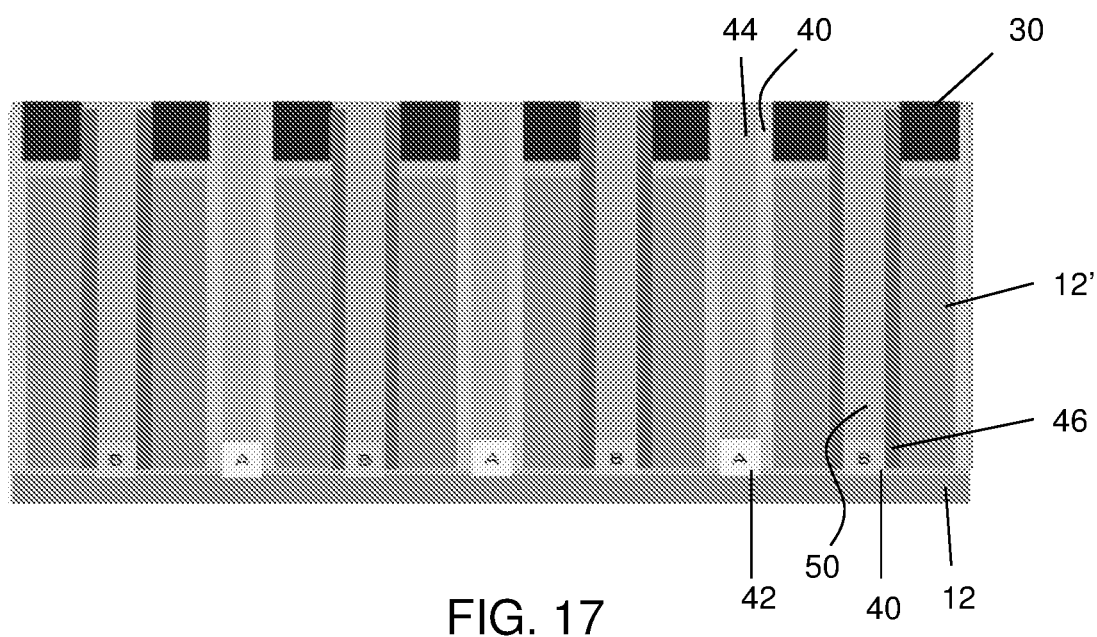
FIG. 17 shows additional trenches filled with insulator material and respective fabrication processes in accordance with aspects of the invention.

In FIG. 17, following the epitaxial growth 48, an insulator material 50 can be formed in the trenches 32. In embodiments, the insulator material 50 can be deposited using a CVD process or a plasma enhanced CVD (PECVD), followed by an etch back process or planarization process, e.g., chemical mechanical polish (CMP). In alternative embodiments, the trenches can be filled using a flowable oxide followed by an anneal process. In yet still additional embodiments, the oxide fill can be a flowable oxide process, followed by a partial recess process, e.g., etch back, and replaced with a high quality high-density-plasma (HDP), CVD oxide. The HDP oxide 50 can then undergo an etch back or planarization process as already described herein.

The structure(s) and processes as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a first set of trenches in a semiconductor material, wherein forming the first set of trenches comprises forming a plurality of first mandrels and forming first sidewall spacers on the first mandrels;
    filling the first set of trenches with a first insulator material; and
    forming a second set of trenches in the semiconductor material, self-aligned to and alternating with the first set of trenches, to form a plurality of fins,
    wherein a pitch of the first set of trenches is approximately one-half a pitch of the plurality of first mandrels.
2. The method of claim 1, wherein the plurality of first mandrels are formed on an insulator layer.
3. The method of claim 1, wherein a pitch of the plurality of fins is approximately one-quarter a pitch of the plurality of first mandrels.
4. The method of claim 1, further comprising:
    filling the second set of trenches with a second insulator material; and
    recessing the first and second insulator materials to partially expose fin sidewalls.
5. The method of claim 1, wherein forming the first set of trenches further comprises:
    removing the plurality of first mandrels; and
    etching trenches through spaces between the first sidewall spacers.
6. The method of claim 1, wherein forming the second set of trenches further comprises forming second sidewall spacers on second mandrels formed from the first insulator material.
7. The method of claim 1, wherein the first insulator material is present when the second set of trenches is formed.
8. The method of claim 1, wherein filling the first set of trenches further comprises depositing a flowable oxide followed by an anneal process.
9. The method of claim 1, wherein filling the second set of trenches further comprises depositing a flowable oxide followed by an anneal process.
10. A method comprising:
    forming a first set of trenches in a semiconductor material, wherein forming the first set of trenches comprises forming a plurality of first mandrels;
    filling the first set of trenches with a first insulator material; and
    forming a second set of trenches in the semiconductor material, self-aligned to and alternating with the first set of trenches, to form a plurality of fins with the first insulator material still present,
    wherein a pitch of the first set of trenches is approximately one-half a pitch of the plurality of the first mandrels.
11. The method of claim 10, wherein forming the first set of trenches further comprises forming first sidewall spacers on the plurality of first mandrels.
12. The method of claim 11, wherein the plurality of first mandrels and the first sidewall spacers are formed on an insulator layer.
13. The method of claim 10, wherein forming the second set of trenches further comprises forming second sidewall spacers on second mandrels formed from the first insulator material.
14. The method of claim 13, wherein the second sidewall spacers are formed by ALD.
15. The method of claim 10, wherein a pitch of the plurality of fins is approximately one-quarter a pitch of the plurality of first mandrels.
16. The method of claim 10, further comprising:
    filling the second set of trenches with a second insulator material; and
    recessing the first and second insulator materials to partially expose fin sidewalls.
17. A method comprising:
    forming a first set of trenches in a semiconductor material, wherein forming the first set of trenches comprises forming a plurality of first mandrels and forming first sidewall spacers on the first mandrels;
    filling the first set of trenches with a first insulator material; and
    forming a second set of trenches in the semiconductor material, self-aligned to and alternating with the first set of trenches, to form a plurality of fins,
    wherein a pitch of the plurality of fins is approximately one-quarter a pitch of the plurality of first mandrels.
18. A method comprising:
    forming a first set of trenches in a semiconductor material, wherein forming the first set of trenches comprises forming a plurality of first mandrels;
    filling the first set of trenches with a first insulator material; and
    forming a second set of trenches in the semiconductor material, self-aligned to and alternating with the first set of trenches, to form a plurality of fins with the first insulator material still present,
    wherein a pitch of the plurality of fins is approximately one-quarter a pitch of the plurality of first mandrels.
19. A method comprising:
    forming a first set of trenches in a semiconductor material, wherein forming the first set of trenches comprises forming a plurality of first mandrels and forming first sidewall spacers on the first mandrels, and wherein forming the first set of trenches comprises (i) removing the plurality of first mandrels and (ii) etching trenches through spaces between the first sidewall spacers;
    filling the first set of trenches with a first insulator material; and
    forming a second set of trenches in the semiconductor material, self-aligned to and alternating with the first set of trenches, to form a plurality of fins.

* * * * *